United States Patent [19]

Friedhelm

[11] Patent Number: 5,406,080
[45] Date of Patent: Apr. 11, 1995

[54] PROCESS FOR MONITORING ION-ASSISTED PROCESSING PROCEDURES ON WAFERS AND AN APPARATUS FOR CARRYING OUT THE SAME

[75] Inventor: Heinrich Friedhelm, Berlin, Germany

[73] Assignee: Fraunhofer Gesellschaft zur Foerderung der angewandten Forschung e.V., Germany

[21] Appl. No.: 218,589

[22] Filed: Mar. 28, 1994

Related U.S. Application Data

[63] Continuation of Ser. No. 768,436, Nov. 7, 1991, Pat. No. 5,319,197.

[30] Foreign Application Priority Data

Mar. 31, 1989 [DE] Germany ............... 39 10 491.5

[51] Int. Cl.$^6$ .................................. G01N 23/225
[52] U.S. Cl. ..................... 250/309; 356/381; 156/626; 156/627
[58] Field of Search ............... 250/309, 305; 356/381, 356/355, 357; 156/626, 627

[56] References Cited

U.S. PATENT DOCUMENTS 4,874,947  10/1989  Ward et al. .................. 250/309
5,223,914  6/1993  Auda et al. .................. 356/381

OTHER PUBLICATIONS

Heinrich et al. Applied Physics Letters, vol. 55, No. 14, Oct. 7, 1961, pp. 1474–1476.
Burrell et al., Review of Scientific Instruments, vol. 51, No. 11, Nov., 1980, pp. 1451–1462.
Dzioba et al. Journal of Applied Physics, vol. 53, No. 1, Jun. 1982, pp. 4389–4390.

*Primary Examiner*—Jack I. Berman
*Attorney, Agent, or Firm*—Evenson, McKeown, Edwards & Lenahan

[57] ABSTRACT

Disclosed is a process and an apparatus for monitoring ion-assisted processing procedures on wafers in a process chamber.

In accordance with the present invention the known process, respectively the known apparatus is improved by, for the determination of the energy of the ions and/or of the divergence of the ion beam, the red shift and/or the blue shift of emission lines resulting from the reflection of particles an the surface of the wafer being determined from the gases present in the process chamber.

12 Claims, 3 Drawing Sheets

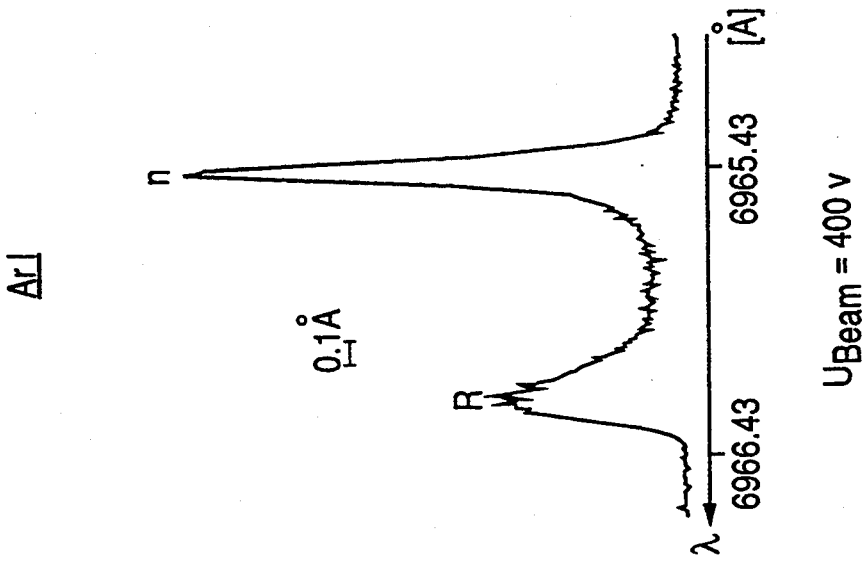
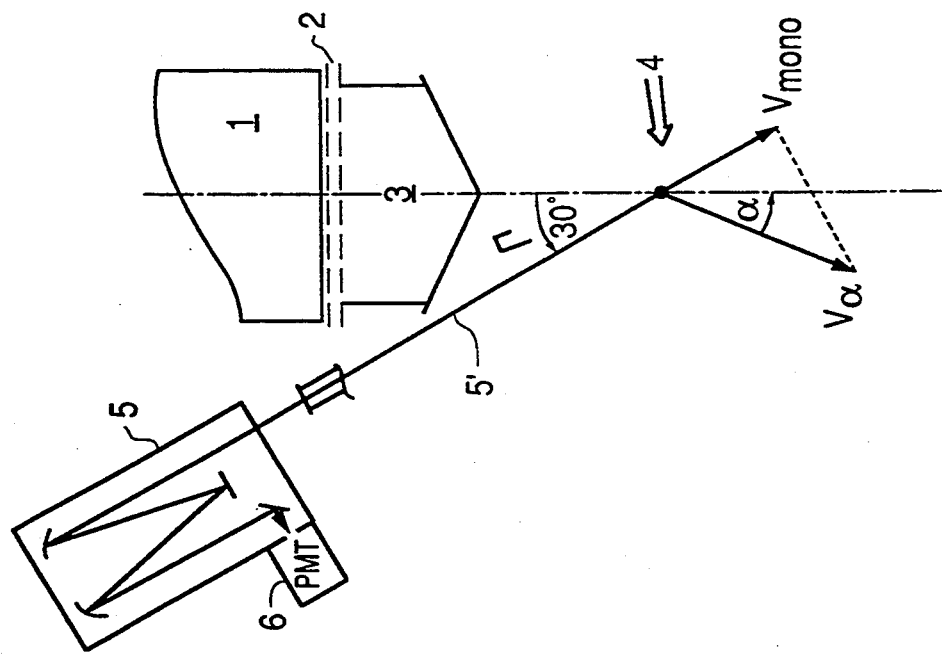

PROCESS FOR MONITORING ION-ASSISTED PROCESSING PROCEDURES ON WAFERS AND AN APPARATUS FOR CARRYING OUT THE SAME

This is a continuation of application Ser. No. 07/768,436, filed Nov. 7, 1991, now U.S. Pat. No. 5,319,197.

FIELD OF THE INVENTION

The present invention relates to a process for monitoring ion-assisted processing procedures on wafers in a process chamber and an apparatus for carrying out the same.

BACKGROUND OF THE INVENTION

Ion-assisted processing procedures are employed both for the removal of material as well as for the application of material, respectively the coating of semiconductor, metal, glass or plastic substrates. The aforementioned materials are summarily referred to hereinafter as "wafer".

Processing procedures in which materials are removed may be, by way of illustration, reactive ion etching "RIE", magnetically enhanced RIE "MERIE", triode etching, reactive ion beam etching "RIBE", chemically assisted reactive ion beam etching "CAIBE", ion milling or sputtering.

In all ion-assisted processing procedures it is essential for conducting the processing to know the energy of the ions and the divergence of the ion beam. Furthermore, in a number of cases it is of importance to determine the possible charging of the wafer as in particular, with thin insulating layers even minimal charging can cause voltage breakdowns. Furthermore, by way of illustration, in the case of RIE it is necessary to determine the etching rate "in situ", respectively to have an "endpoint control" of the processing procedure.

Determination of the aforementioned values, respectively processing parameters, is only possible in accordance with the state of the art by means of a number of different measuring processes, which, under circumstances, have to be employed simultaneously in a process chamber. Thus presently the divergence of the ion beam is usually measured (measurement of current) with "conductive cups". The arrangement of the measuring devices in a process chamber necessary for this purpose however "disturbs" the ion beam and therefore the processing procedure. The thickness of the layer, on the other hand, is usually measured interferometrically so that the process chamber has to be designed in such a manner that, by way of illustration, a laser interferometer may be utilized, cf. e.g. the PCT application WO 88/07261. The use of an optical spectrometer for the chemical identification of reaction products of the surface of a wafer is also described in this printed publication.

SUMMARY OF THE INVENTION

The present invention provides a process for monitoring ion-assisted processing procedures on wafers in a process chamber with which magnitudes, i.e., processing parameters, essential for conducting the processing may be determined practically simultaneously with a minimal amount of time, effort and cost.

In the invented process it was recognized that the magnitudes, i.e. process parameters, of importance for the ion-assisted processing procedures on wafers can be determined by means of emission spectography of the operational gases present in the process chamber. Operational gases mean all the gases present in the process chamber, thus, by way of illustration, the ions i.e. fast neutral particles) supplied by the ion source, the background gas present in the chamber (typical pressure in the operation chamber $\approx 10^{-6}$ to $10^{-7}$ mbar), additional operational gas present in the process chamber as is the case in CAIBE processes or coating, or reaction products of the surface.

On the way between the ion source and the wafer surface, a part of the ions collides with neutral particles in the process chamber. With a certain degree of probability, these collision processes result in electronic excitation of the colliding ions and particles. The light generated in "neutralizing" the electronic excitation is "Doppler shifted" toward longer wavelengths, that is "red-shifted", compared to thermal particles due to the velocity of the colliding particles and ions. From the distance between, e.g., the red-shifted maximum and the unshifted maximum, which occurs with thermal particles, therefore the velocity and thus the energy of the particles can be calculated.

Moreover, with a certain degree of probability, the particles reflected by the surface of the wafer are electronically excited by the collision with the wafer. In the case of these particles, a blue shift of the emission lines occurs.

Also from the distance between the blue-shifted maximum and the unshifted maximum, the particle energy can again be determined.

Furthermore, the spectral width of the distribution of the emissions about the red-shifted or the blue-shifted maximum permits drawing conclusions about the beam divergence Moreover, the charging of the wafer results in counter voltage which slows down the ions thus reducing the spectral red and blue shift. For this reason, in accordance with the invention in order to determine possible charging of the wafer, the spectral position of the red-shifted and/or blue-shifted maximum, i.e. the temporal change of the spectral position, is ascertained.

This permits, i.a., for the first time a reliable DC bias measurement, i.e. a determination of the potential difference between plasma and wafer in RIE processing procedures. In cathodic extraction (DC, HF or NF) via a plasma peripheral layer, as is the case in RIE processes and in RI deposition processes, not only is determination of the automatically occuring potential difference possible via the energy of the particles, but, in particular, in the case of low pressure also the determination of the distribution of the energy of the particles.

A part of the emitted light enters the detection device directly, whereas the other part of the light which entered the detection device was first reflected at the surface of the wafer.

If the wafer is a coated wafer, by way of illustration a Si-wafer coated with a $SiO_2$ layer, there are interferences of the light reflected at the upper and Lower boundary surfaces. Thus the intensity of the received light is dependent on the thickness of the layer.

For this reason, in accordance with the invention, in order to determine the current thickness of the processed layer, the temporal change of the intensity of the blue-shifted or the unshifted spectral lines and/or the spectral position of the blue-shifted maximum is ascertained.

Both the values of the red as well as the blue shift of the emission lines of the operation gases in the process chamber can, by way of illustration, be measured with a monochromator having a photomultiplier tube connected thereafter or having other detection devices, such as interference filters. In any case, it is preferable if the detection device ascertains the various emissions collinearly, i.e. in the axis of the ion beam (claim 6). This has both the advantage that in that case the magnitude of the measured shift is the greatest with given particle velocity and also the advantage that the determination of the thickness of the layer is simplified.

BRIEF DESCRIPTION OF THE DRAWINGS

The present invention is made more apparent in the following section using preferred embodiments with reference to the accompanying drawings.

FIG. 1 shows the principle construction of an apparatus for carrying out the invented process;

FIGS. 2 shows measuring results obtained with the apparatus illustrated in FIG. 1;

DESCRIPTION OF THE DRAWINGS

Figure 3:
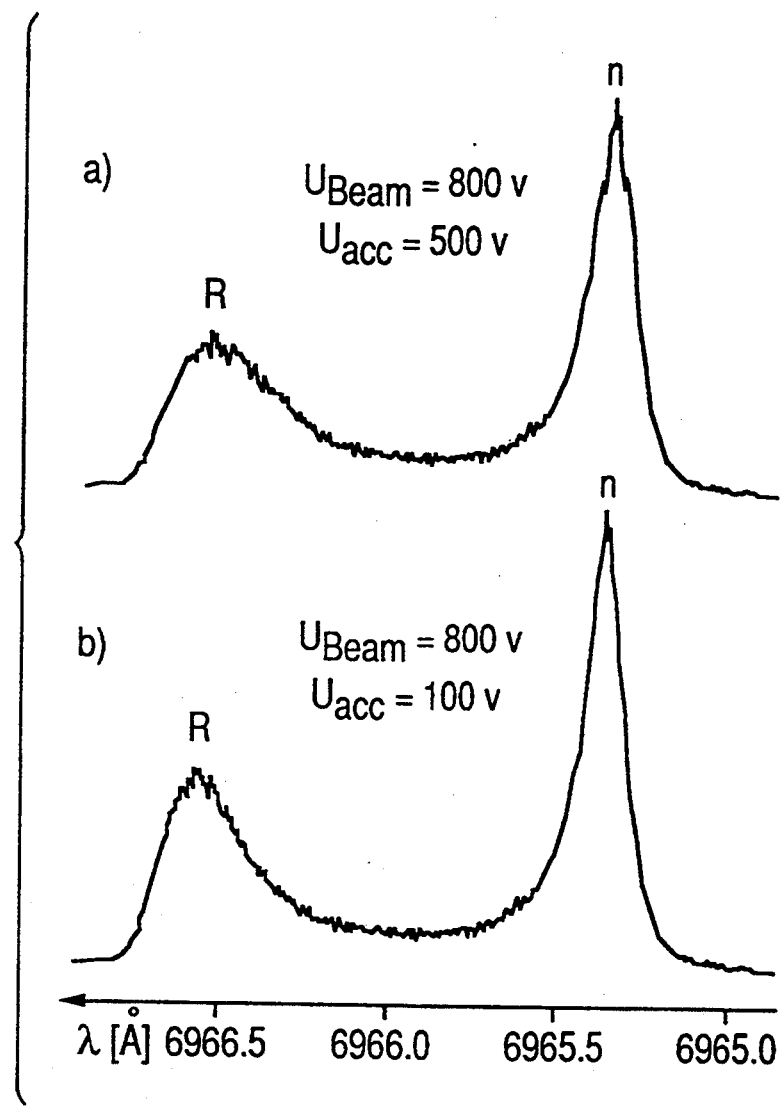
FIG. 3 shows measuring results obtained with the apparatus illustrated in FIG. 1.

The apparatus depicted in FIG. 1 has an ion source 1 which supplies ions as plasma from which a number of grating 2 accelerates an ion beam 3 on a not depicted wafer. In the illustrated preferred embodiment, a two-grating optics is utilized. It is expressly pointed out that the design of the ion source for the invented process is not decisive and that the invented process, by way of illustration, may also be applied if —as, by way of illustration, in the case of the RIE process —ions are accelerated out of a plasma onto walls, etc., via an automatically occuring potential so that in a real sense it actually is not an ion beam.

The ions of the ion beam collide with the other particles in proportion to the gas background pressure in the process chamber (approx. $10^{-7}$–$10^{-6}$ mbar). This is symbolized in FIG. 1 by the reference number 4, with gas, i.e. operation gas, referring to all the gases present in the process chamber, thus, by way of illustration, the ions (respectively recombined neutral particles) supplied by the ion source, the background gas present in the chamber, additional operation gas present in the process chamber as is the case in CAISE processes, or reaction products from the surface.

These collision processes result with a certain degree of probability in electronic excitation of the colliding ions and particles. The light generated in "neutralizing" the electronic excitation is detected in the preferred embodiment illustrated in FIG. 1 with a monochromator 5 which has a photomultiplier 6. The axis 5' of the monochromator 5 is arranged in the illustrated preferred embodiment under an angle $\Gamma = 30°$ to the axis of the ion beam 3. Following collision, the direction of motion of the "colliding ion" includes the angle $\alpha$ with the axis of the ion beam. $v_\alpha$ is the velocity of the ion following collision.

In the following measuring results obtained with the apparatus illustrated in FIG. 1 are explained using FIGS. 2 to 5, with measurements in the range of the unshifted (neutral) argon line $\lambda 0 = 696.543$ nm (6965.43 Å) being illustrated. Naturally, depending on the instance of application practically any emission lines of the utilized ions and/or particles present in the process chamber can be evaluated.

FIG. 2 depicts a typical measurement in the range of Ar I line if no substrate is present in the process chamber. In addition to the "sharp" unshifted emission line n stemming from thermal particles, a smaller "red-shifted" maximum R stemming from the fast particles is observed.

In this case the wavelength shift $\Delta\lambda$, d.h. the spectral distance between the unshifted maximum n and the red-shifted maximum R, is given by the projection of the particle velocity $v_\alpha$ on the axis of the monochromator axis 5':

$$\Delta\lambda = \lambda_0 * V_\alpha * \cos(\Gamma \pm \alpha)$$

$\lambda 0$ is the wavelength of the unshifted emission line). As the deflection angle $\alpha$, among other things is a function of the beam divergence, the particle velocity can be determined from the distance of the red-shifted peak maximum from the unshifted maximum and therewith the energy of the ion beam and from the width of the red-shifted maximum at least qualitative conclusions can be drawn about the divergence of the ion beam.

FIG. 3 shows the influence of various beam divergences on the "shape" of the red-shifted maximum, with the measuring result with a beam having comparatively large divergences being depicted in section (a) and in section (b) the result with a beam having a small divergence. The beam data are to be drawn from the respective section. $U_{BEAM}$ designates the velocity voltage and $U_{acc}$ the voltage applied to the second grating of the two-grating optics (related to 0 V).

Figure 4:
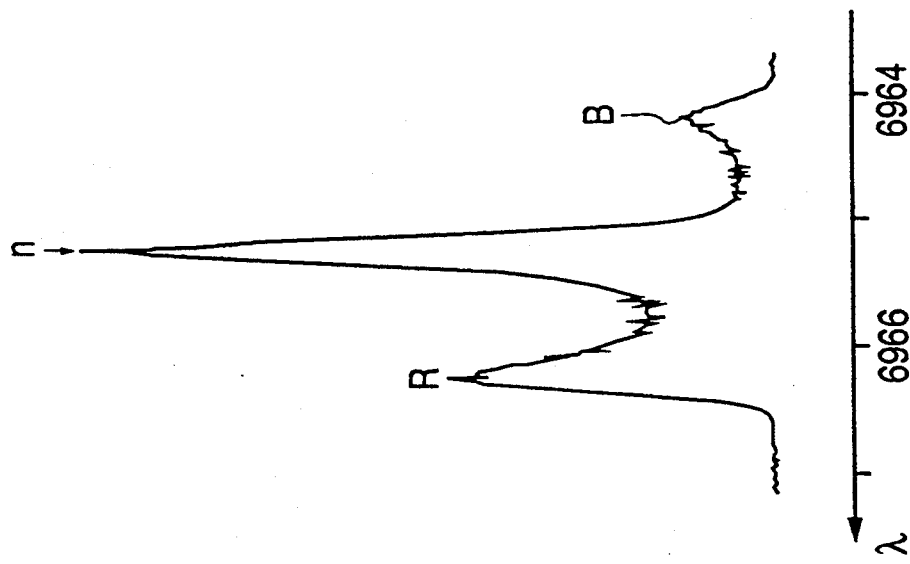
FIG. 4 shows measuring results obtained with the apparatus illustrated in FIG. 1.

FIG. 4 depicts the result obtained if a wafer is disposed in the ion beam 3. Due to reflection at the surface of the wafer, a maximum B shifted to shorter wavelengths (blue-shifted) also occurs, from the distance of which to the unshifted maximum the particle energy can be determined and from the width of which information can be gained about the beam divergence.

Figure 5:
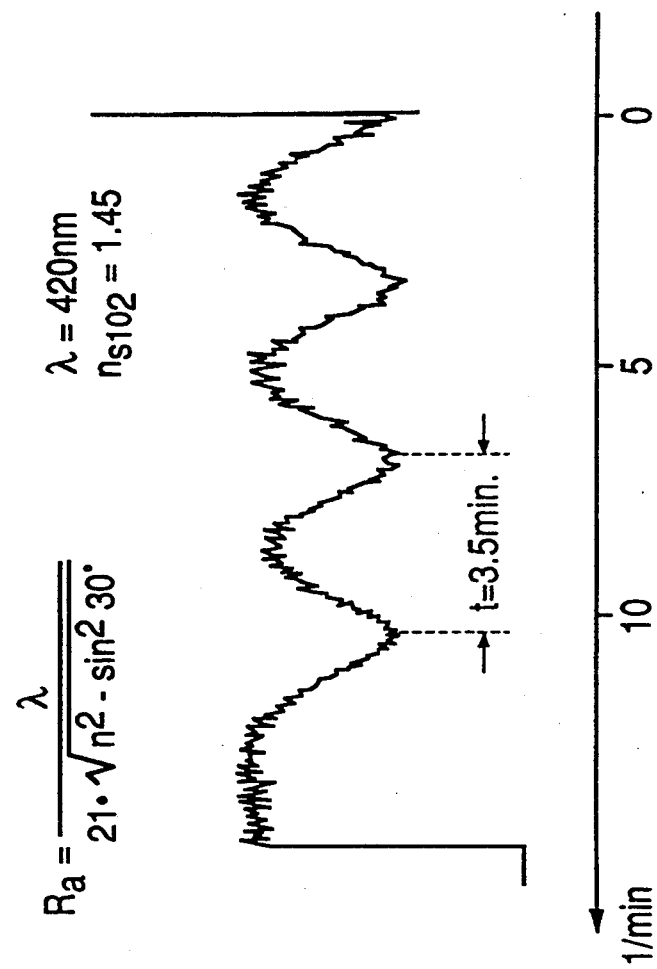
FIG. 5 shows measuring results obtained with the apparatus illustrated in FIG. 1.

FIG. 5 depicts the temporal variation of the intensity of the "blue-shifted" maximum in the case of a coated wafer. Due to the short lifetime (approx. 10–100 ns) of the electronically excited states, only particles are detected in the emission spectrum which are in a range having a thickness of several millimeters above the surface of the wafer. A part of the emitted light enters directly into the detection device, whereas the other part of the light which entered directly into the detection device was first reflected at the surface of the wafer.

If the wafer is a coated wafer, by way of illustration, a Si-wafer coated with a layer of $SiO_2$, there are interferences of the light reflected at the upper and the lower boundary surfaces. Thus the intensity of the received light is dependent on the thickness of the layer.

The "sputtering" processing procedure illustrated, by way of example, in FIG. 5 yields a purely sinus-shaped interference signal, from the "period" of which the etching rate $R_a$ can be determined using the following formula:

$$R_a = \lambda/2 * t \sqrt{(n^2 - \sin^2\Gamma)}.$$

with t being the temporal interval between two maxima (minima) and n the refractive index of the upper layer.

If the oxide layer is removed in the case of the illustrated embodiment, the signal no longer changes so than a reliable end point control is yielded.

In the illustrated preferred embodiment the axis 5' of the monochromator 5 and the axis of the ion beam 3 include an angle $\Gamma < \leq 0°$. In many applications, however, it is preferred if the angle is $\Gamma = 0°$, as in that event the determination of the thickness of the layer is simplified and the shift of the maxima is the greatest with the given particle velocity. This can be realized by utilizing a "transparent" source 1, "after" which the detection device for the emitted light is disposed. A particular advantage of the use of shifted lines is namely that in this way it is possible no "look through" the ion source and the extraction optics.

Furthermore, in order to determine the etching rate, it is also possible to evaluate the unshifted emission line. A spectral separation of the lines is not necessary for the evaluation. Other devices may also be employed as the detection device, such as interference filters with photomultipliers connected thereafter or other light receivers.

In any event, the invented process, however, has the advantage that it is possible to practically simultaneously determine the energy of the ions, the beam divergence, the thickness of the layer and the end point of the processing as well as the charging of the wafer.

The present invention may be utilized for monitoring all ion-assisted processing procedures and, in particular, in the case of removal of material and application of material, respectively coating semiconductor, metal, glass or plastic substrates.

What is claimed is:

1. Process for monitoring a thickness of a thin film on an underlying substrate in a process chamber, the process comprising the steps of:

using as a source of illumination an optical emission of a light emitting medium which is used for processing or is generated during processing; and reflecting said optical emission by one of said thin film and said underlying layer, said reflecting optical emission interfering such that a detected light is a periodic function of said thickness of said thin film.

2. Process according to claim 1, wherein said light emitting medium is one of a plasma and an ion beam.

3. Process according to claim 1, wherein a change in thickness corresponding to one cycle or period of reflected light intensity divided by the duration of that cycle is proportional to an etching or deposition rate.

4. Process according to claim 1, wherein the wavelength of the detected light can be selected.

5. Process according to claim 1, wherein an etching or deposition rate is determined in situ during said process.

6. Process according to claim 2, wherein an etching or deposition rate is determined in situ during said process.

7. Process according to claim 3, wherein an etching or deposition rate is determined in situ during said process.

8. Process according to claim 4, wherein an etching or deposition rate is determined in situ during said process.

9. Apparatus for carrying out the process according to claim 1, wherein the source of illumination is a light emitting medium which is used for processing or is generated during processing, the light is transmitted through means for monochromating the light to a detector to detect the intensity of the light.

10. Apparatus according to claim 9, wherein the light emitting medium is one of a plasma and an ion beam.

11. Apparatus according to claim 9, wherein said means for monochromating is at least one of a fixed-wavelength filter and a tunable-wavelength filter.

12. Apparatus according to claim 9, wherein a detector is one of a charged coupled device (CCD), an array of photodiodes, and a photomultiplier.

* * * * *